(12) United States Patent
Millward et al.

(10) Patent No.: US 8,173,034 B2
(45) Date of Patent: May 8, 2012

(54) METHODS OF UTILIZING BLOCK COPOLYMER TO FORM PATTERNS

(75) Inventors: Dan Millward, Boise, ID (US); Stephen J. Kramer, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 792 days.

(21) Appl. No.: 12/272,517

(22) Filed: Nov. 17, 2008

(65) Prior Publication Data

US 2010/0124826 A1 May 20, 2010

(51) Int. Cl.
C03C 15/00 (2006.01)
C03C 25/68 (2006.01)
C23F 1/00 (2006.01)
B44C 1/22 (2006.01)

(52) U.S. Cl. .......................... 216/41; 438/780; 427/256
(58) Field of Classification Search ................... 216/41; 438/780; 427/256
See application file for complete search history.

(56) References Cited

U.S. PATENT DOCUMENTS

| | | | |
|---|---|---|---|
| 5,948,470 A | 9/1999 | Harrison et al. | |
| 7,335,580 B1 | 2/2008 | Buerger, Jr. et al. | |
| 2007/0175859 A1* | 8/2007 | Black et al. | 216/41 |
| 2008/0093743 A1 | 4/2008 | Yang et al. | |
| 2009/0317540 A1 | 12/2009 | Sandhu et al. | |

OTHER PUBLICATIONS

Yamaguchi, Toru, et al. "Resist-Pattern Guided Self-assembly of Symmetric Diblock Copolymer" Journal of Photopolymer Science and Technology, vol. 19, No. 3 Jun. 12, 2006, pp. 385-388.

Segalman, Rachel A., "Patterning with block copolymer thin films" Material Science and Engineering, Reports: A Review Journal, 2005, pp. 191-226.

Black, C.T., et al. "Polymer self assembly in semiconductor microelectronics" IBM Journal of Research and Development, vol. 51, No. 5, Sep. 2007, pp. 605-633.

Kim, Ho-Cheol, et al. "Fabrication of 20 nm half-pitch gratings by corrugation-directed self-assembly" IOP Publishing, Nanotechnology 19, May 6, 2008, pp. 1-5.

Krishnamoorthy, Sivashankar, et al. "Nanoscale patterning with block copolymers" materialstoday, Sep. 2007, vol. 9, No. 9, pp. 40-47.

Sundstrom, Linnea, et al. "Patterning—20 nm half-pitch lines on silicon using a self-assembled organosilicate etch mask" Applied Physics LEtters, Letter 88, 243107, Published Jun. 13, 2006, http://scitation.aip.org/getabs/servlet/GetabsServlet?prog=normal&id=APPLAB000088000024243107000001&idtype=cvips&gifs=yes, 1 page.

Park, Sang-Min et al., "Directed Assembly of Lamellae-Forming Block Copolymers by Using Chemically and Topographically Patterned Substrates", Adv. Mater 2007, 19, 607-611.

* cited by examiner

*Primary Examiner* — Roberts Culbert
(74) *Attorney, Agent, or Firm* — Wells St. John P.S.

(57) ABSTRACT

Some embodiments include methods of utilizing block copolymer to form patterns between weirs. The methods may utilize liners along surfaces of the weirs to compensate for partial-width segments of the patterns in regions adjacent the weirs. Some embodiments include methods in which spaced apart structures are formed over a substrate, and outer surfaces of the structures are coated with a thickness of coating. Diblock copolymer is used to form a pattern across spaces between the structures. The diblock copolymer includes a pair of block constituents that have different affinities for the coating relative to one another. The pattern includes alternating segments, with the segments adjacent to the coating being shorter than the segments that are not adjacent to the coating. The coating thickness is about the amount by which the segments adjacent to the coating are shorter than the segments that are not adjacent to the coating.

35 Claims, 15 Drawing Sheets

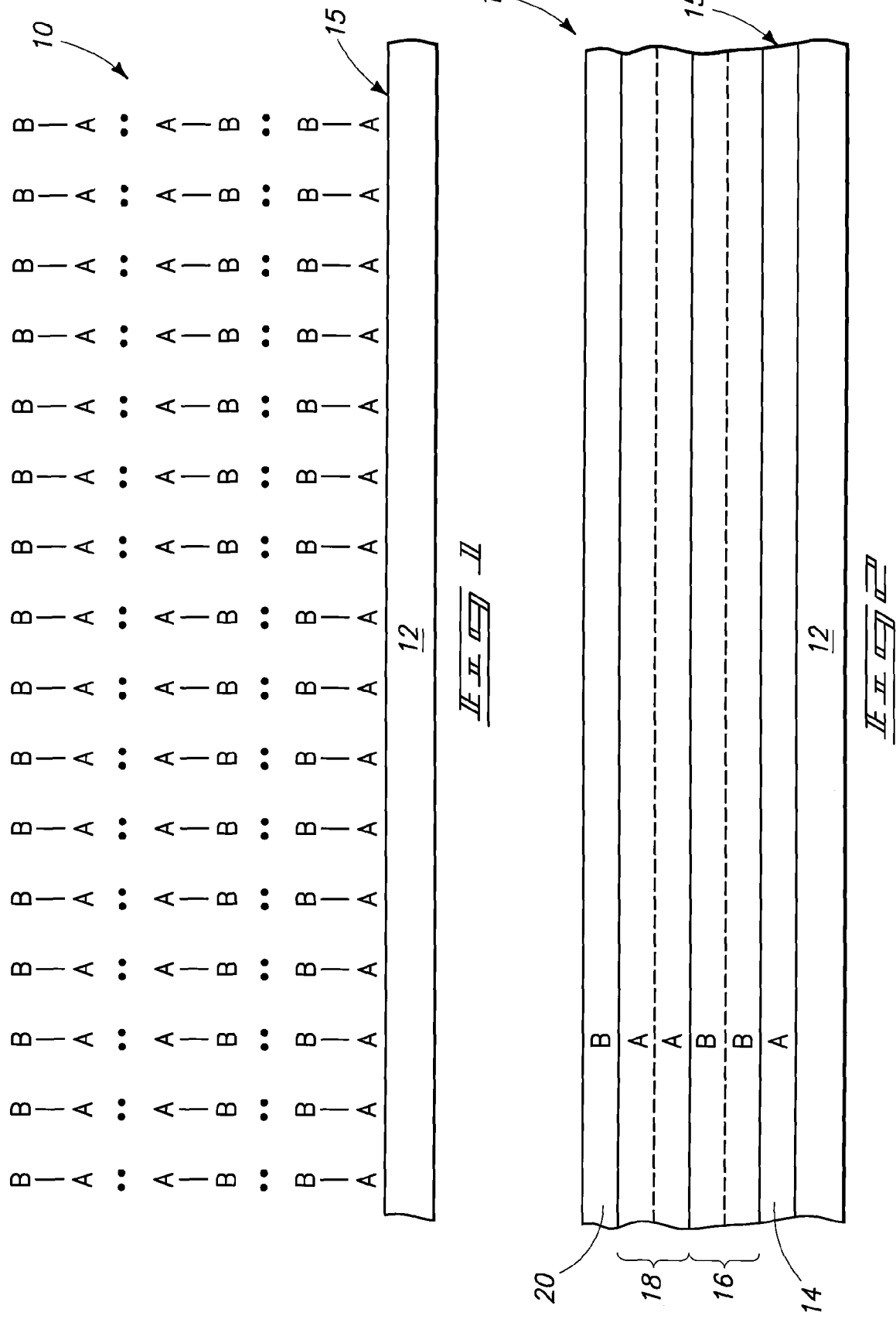

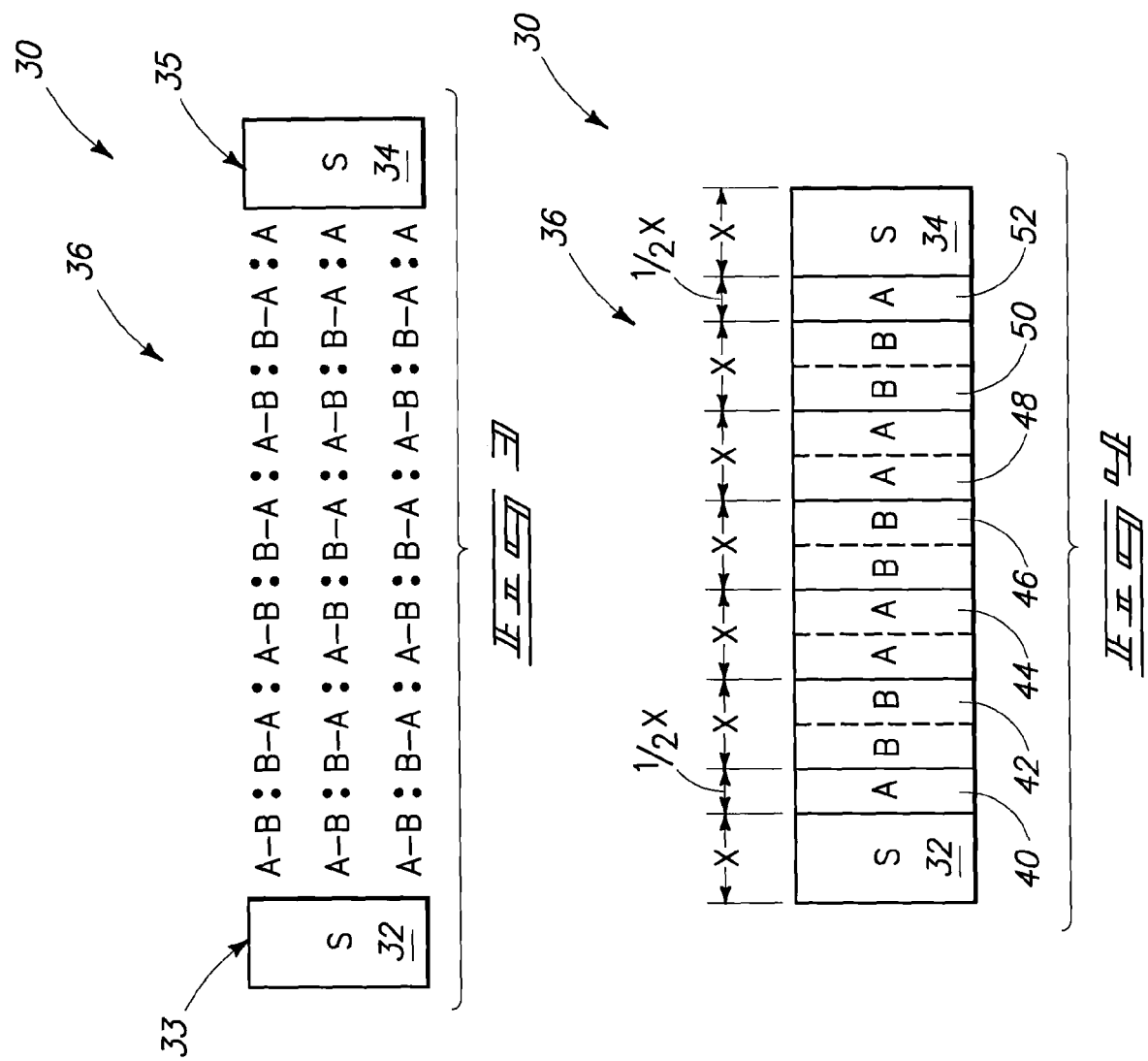

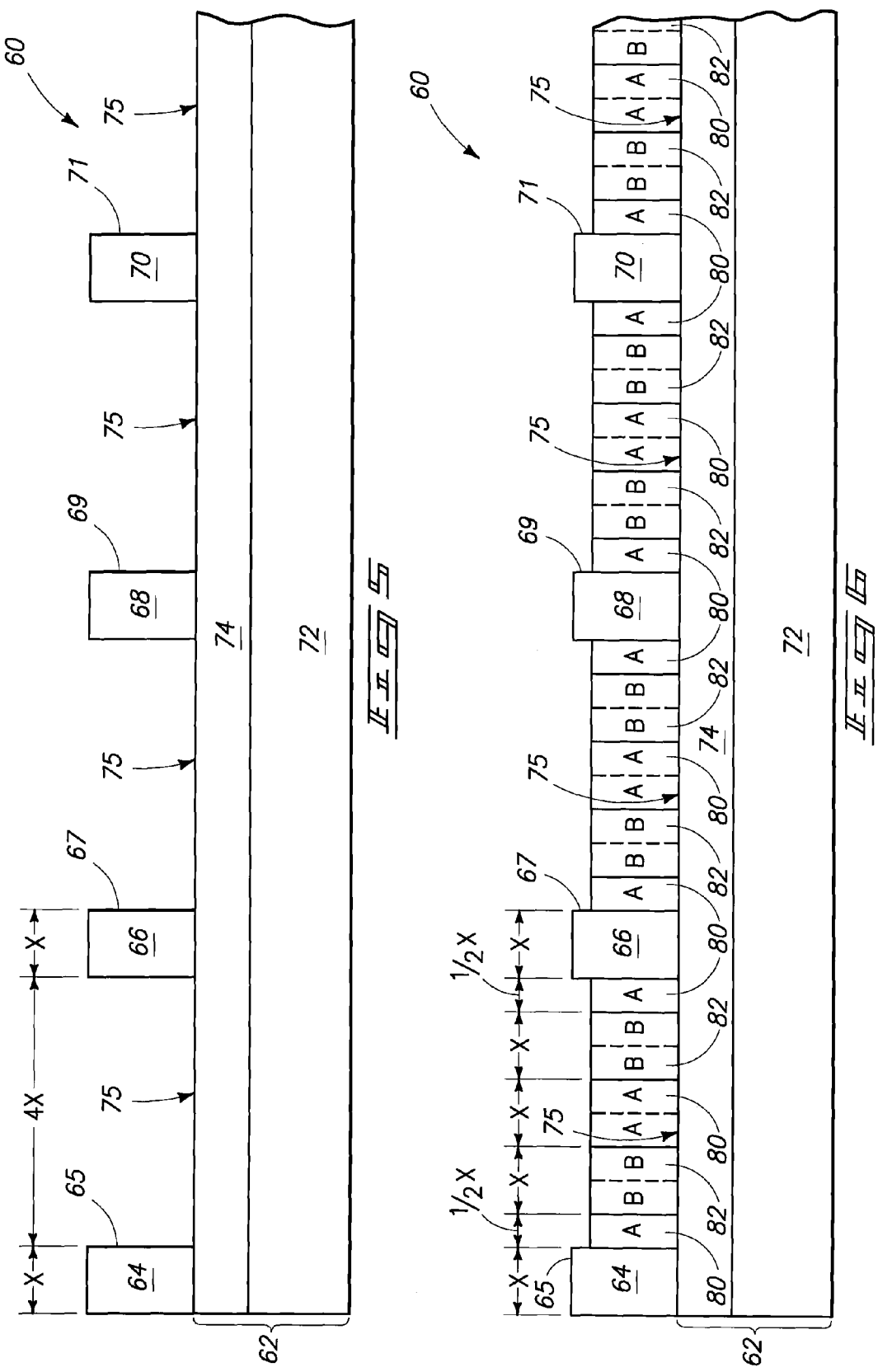

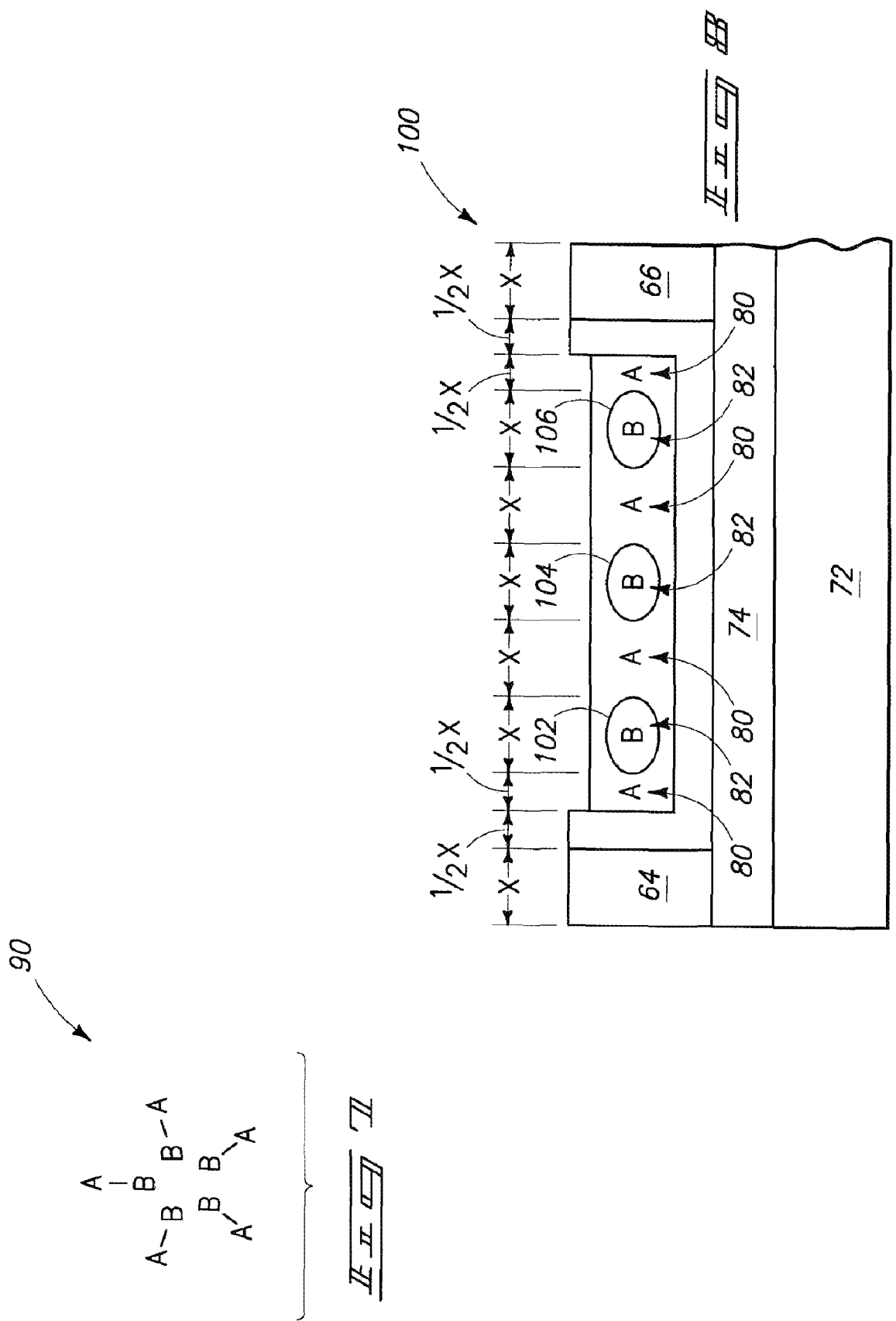

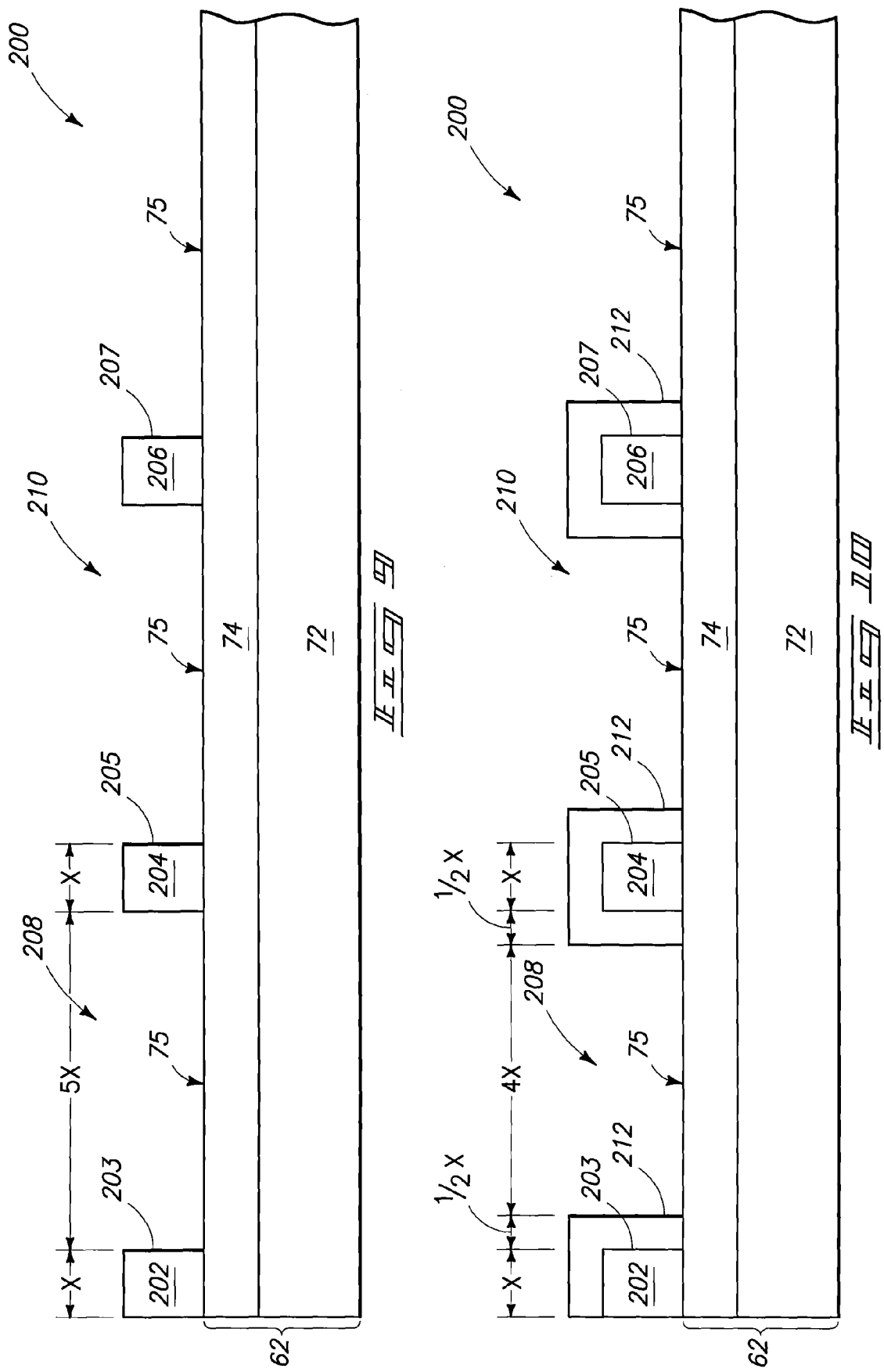

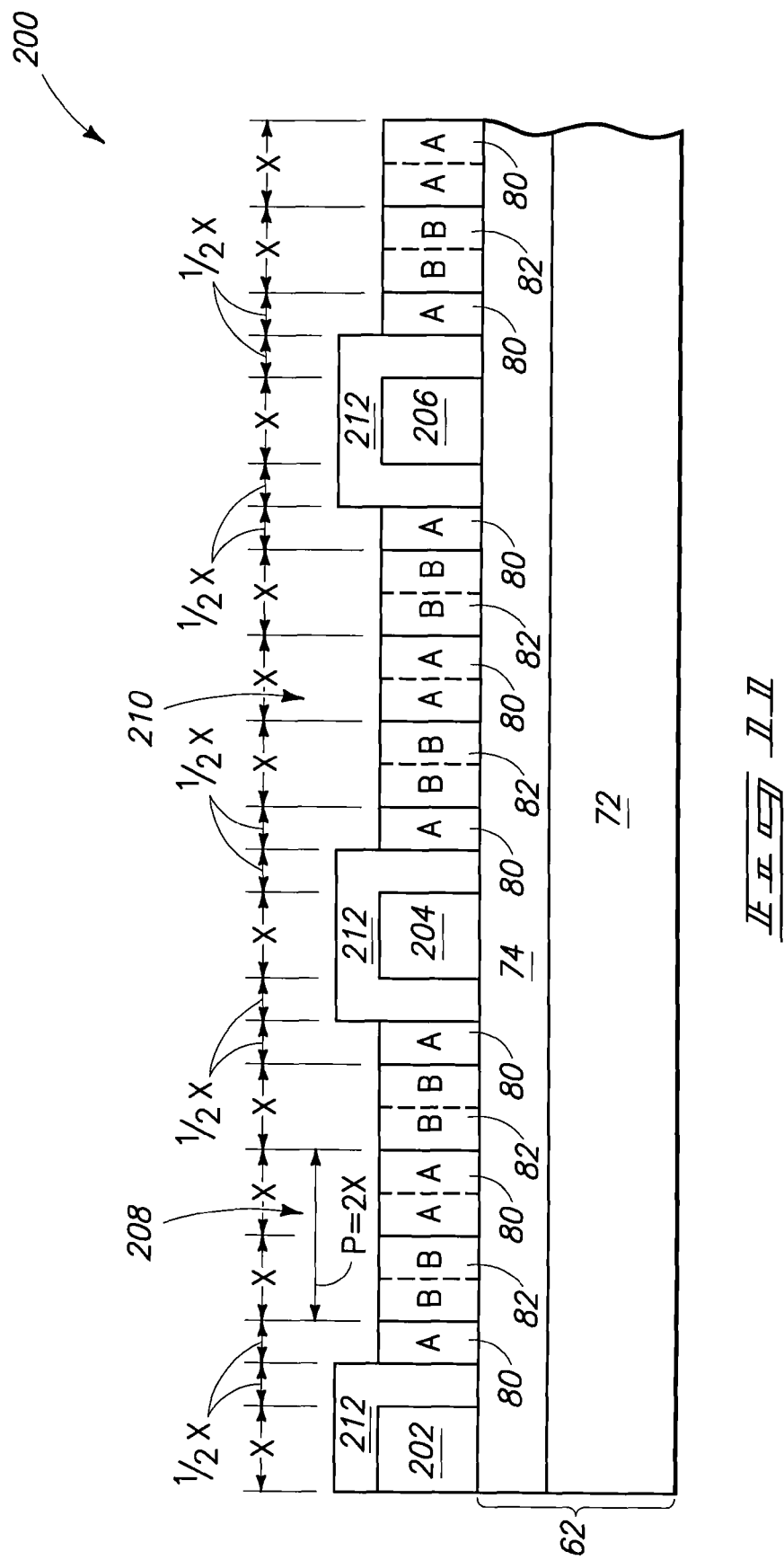

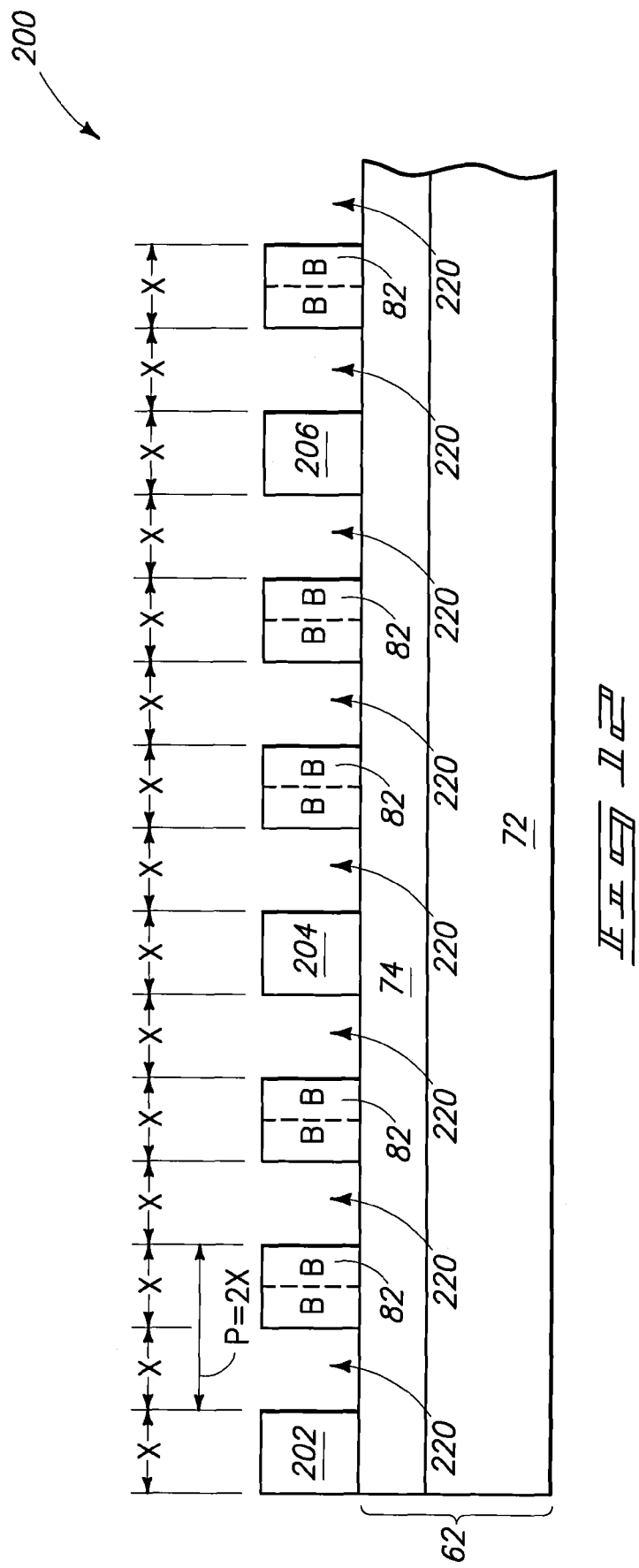

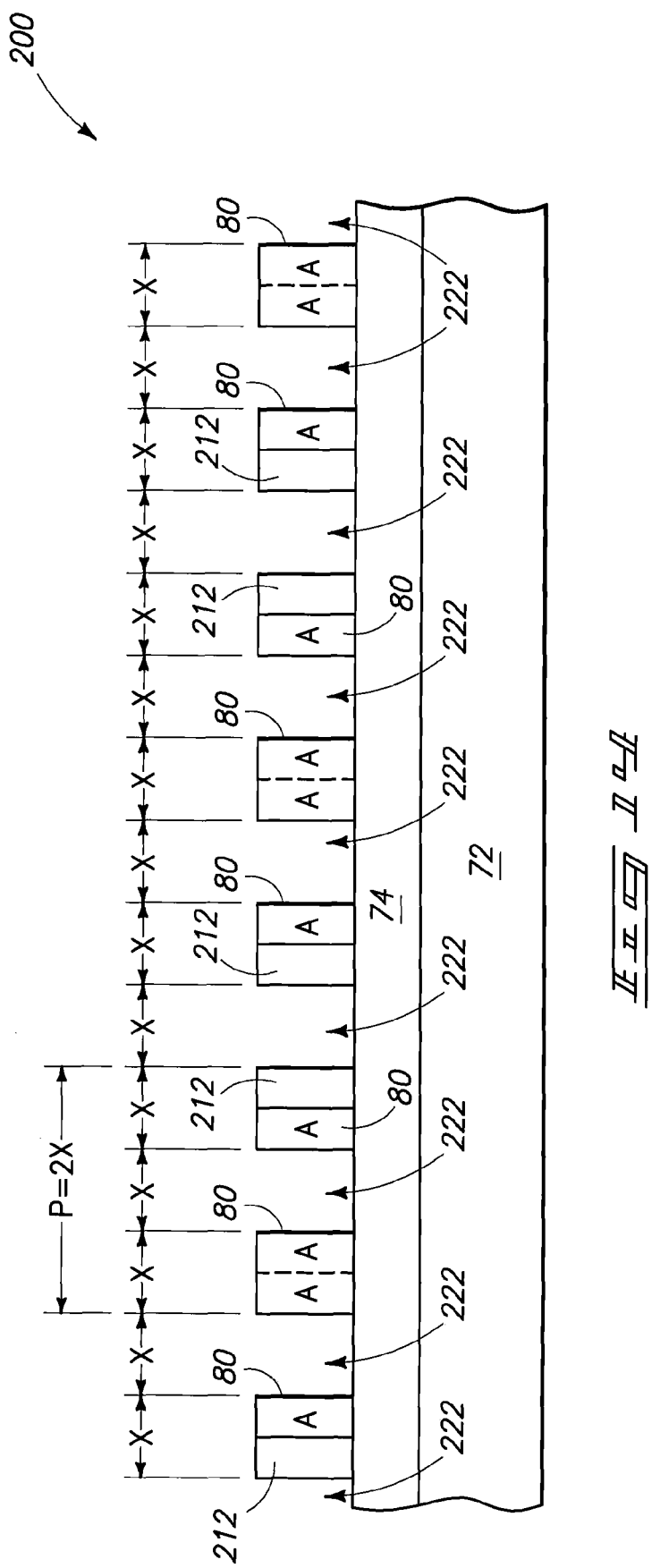

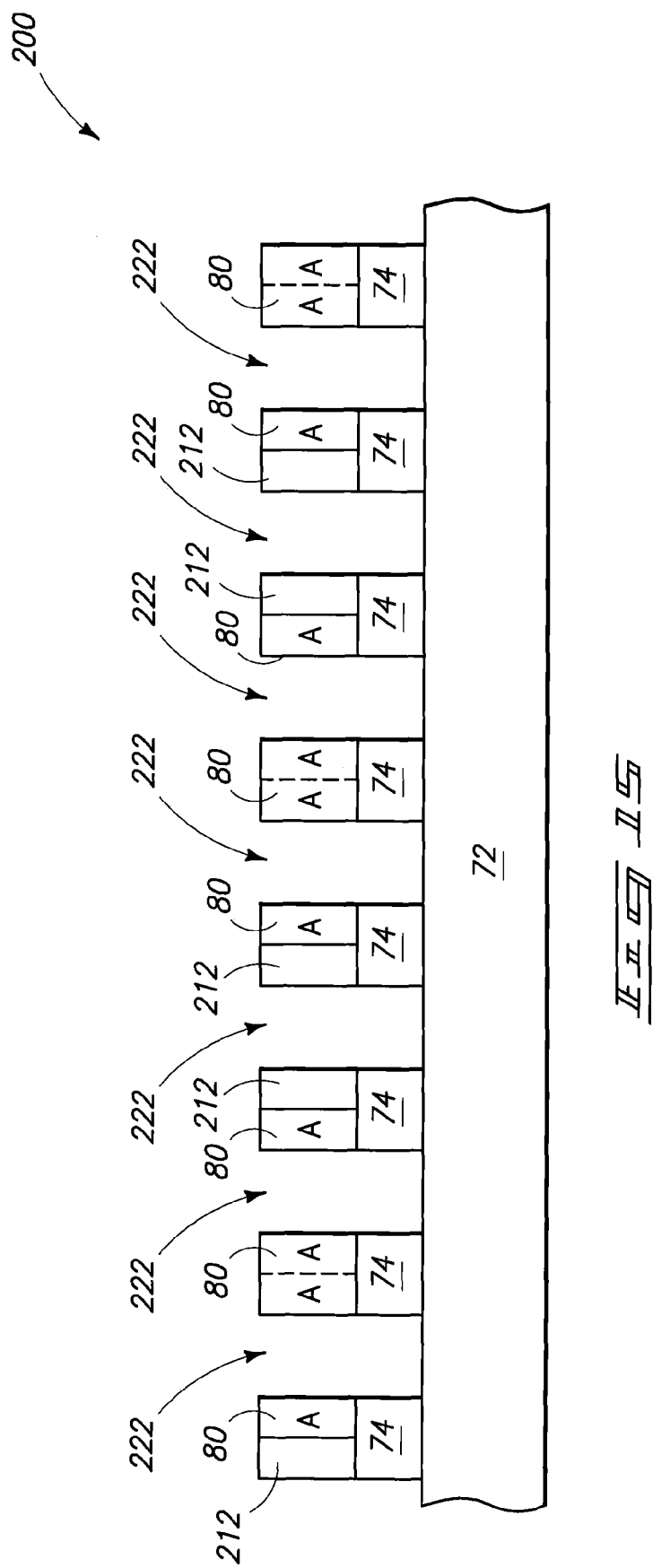

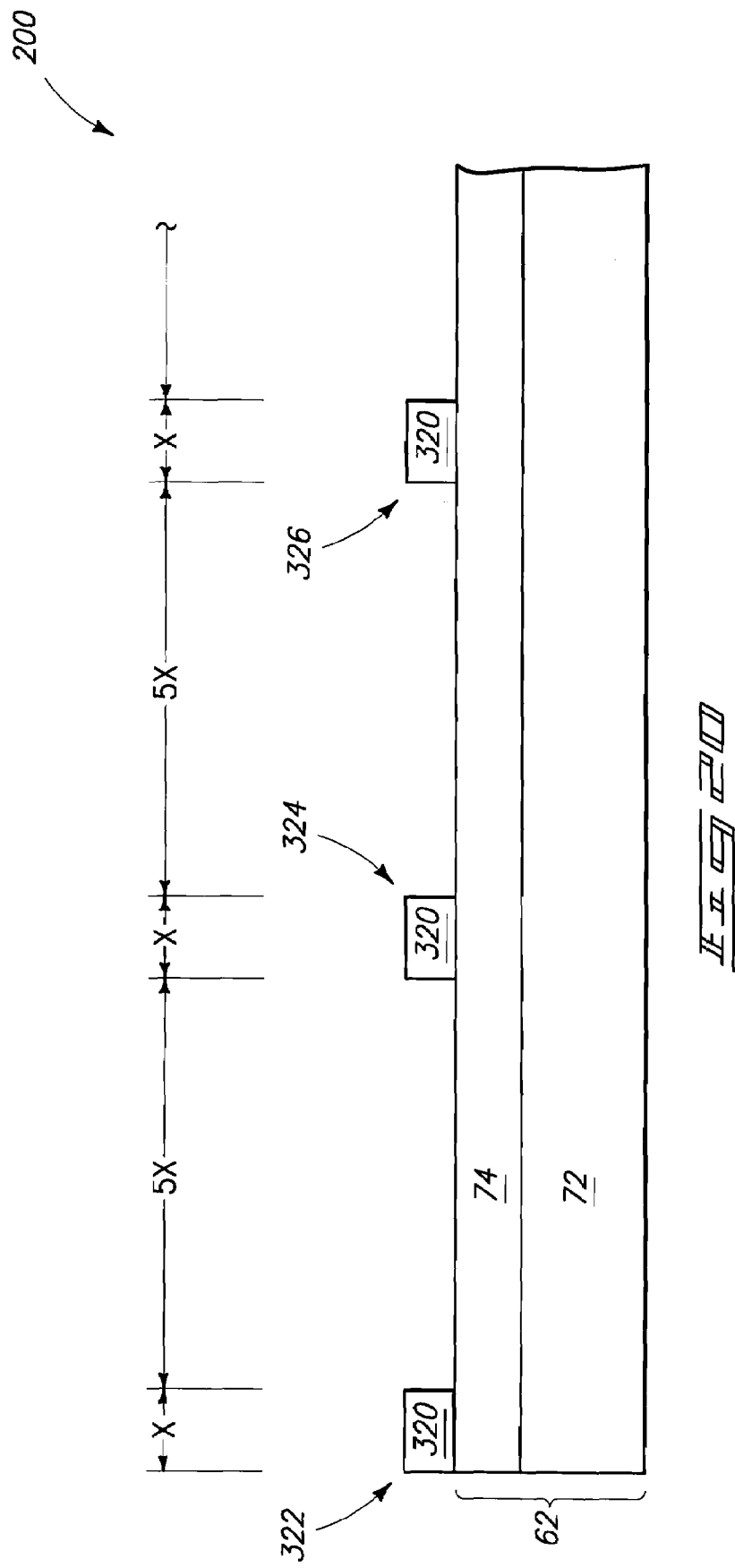

METHODS OF UTILIZING BLOCK COPOLYMER TO FORM PATTERNS

TECHNICAL FIELD

Methods of utilizing block copolymer to form patterns.

BACKGROUND

Numerous applications exist in which it is desired to form repeating patterns having a small pitch (for example, a pitch of less than about 50 nanometers). For instance, integrated circuit fabrication may involve formation of a repeating pattern of memory-storage units (i.e., NAND unit cells, dynamic random access [DRAM] unit cells, cross-point memory unit cells, etc.).

Photolithography is a conventional method utilized for fabrication of integrated components. Photolithography utilizes light to pattern a photosensitive material. The photolithographically-patterned photosensitive material may then be utilized as a mask for patterning underlying materials to form the integrated circuit components.

A continuing goal of integrated circuit fabrication is to increase integrated circuit density, and accordingly to decrease the size of individual integrated circuit components. There is thus a continuing goal to form patterned masks having increasing densities of individual features. In cases in which the patterned masks comprise repeating patterns of features, there is a continuing goal to form the repeating patterns to higher density, or in other words, to decrease the pitch.

If only photolithography is utilized to pattern integrated circuit components, integrated circuit density cannot increase beyond a threshold dictated by the minimum attainable feature size obtainable utilizing the particular photolithographic technology. The minimum feature size is dictated by, for example, a wavelength utilized during the photolithography.

Several methods have been developed which can be utilized in combination with photolithography to push the minimum attainable feature size to smaller dimensions than may be achieved with photolithography alone. Among such methods is a procedure comprising utilization of a block copolymer to form a pattern between a pair of photolithographically-patterned features. The pattern created with the block copolymer may be at higher density than is achievable with photolithography, and thus block copolymer may be utilized to create higher integrated circuit densities than are achievable with photolithography alone.

It would be desirable to develop new methods of forming patterns with block copolymers which enable repeating patterns to be formed to high density. It would be further desirable for such methods to be readily applicable for semiconductor device fabrication.

BRIEF DESCRIPTION OF THE DRAWINGS

FIGS. 1 and 2 illustrate a method of utilizing a diblock copolymer to form a pattern.

FIGS. 3 and 4 illustrate another method of utilizing a diblock copolymer to form a pattern.

FIGS. 5 and 6 illustrate another method of utilizing a diblock copolymer to form a pattern.

FIGS. 7 and 8 illustrate another method of utilizing a diblock copolymer to form a pattern.

FIGS. 9-11 illustrate another method of utilizing a diblock copolymer to form a pattern, and illustrate an example embodiment method for adjusting for a problem present in the methods of FIGS. 3-8.

FIGS. 12 and 13 illustrate example processing that may follow the processing stage of FIG. 11 in some embodiments.

FIGS. 14 and 15 illustrate example processing, alternative to that of FIGS. 12 and 13, that may follow the processing stage of FIG. 11 in some embodiments.

FIGS. 19 and 20 illustrate another example process for forming a structure of the type shown in FIG. 9.

DETAILED DESCRIPTION OF THE ILLUSTRATED EMBODIMENTS

Figure 11:
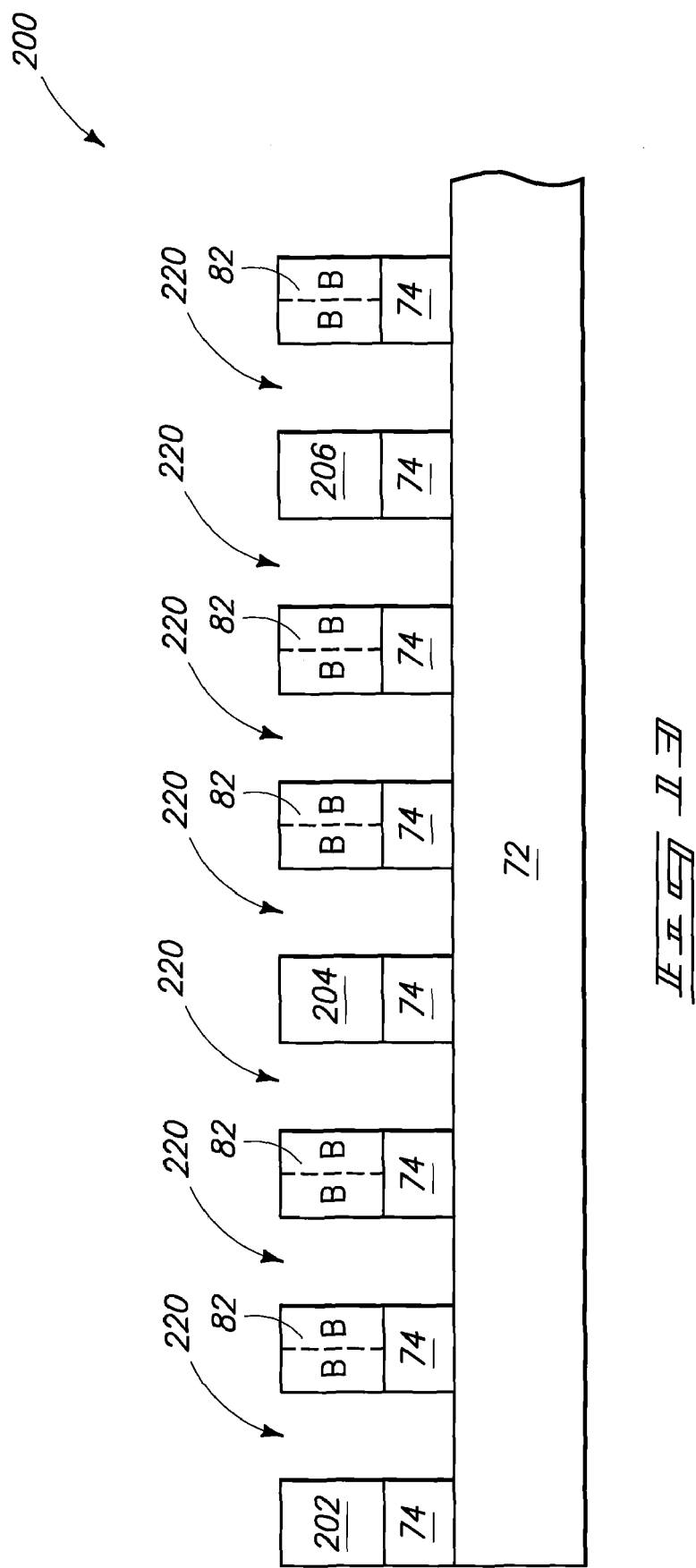

Copolymers are polymers derived from two or more monomeric species. Block copolymers contain two or more homopolymer subunits linked by covalent bonds. The union of the homopolymer subunits may utilize an intermediate linkage, known as a junction block. Block copolymers with two distinct blocks are referred to as diblock copolymers. Example diblock copolymers include polystyrene-b-poly (2-vinylpyridine) (PS-b-P2VP); polystyrene-b-poly (ethylene-alt-propylene); polystyrene-b-poly(methylmethacrylate) (PS-b-MMA); and polystyrene-b-poly(dimethyl-siloxane) (PS-b-PDMS). The "b" utilized in each of the above chemical formulas indicates a block linkage.

Diblock copolymers may be generically represented as A-B, where the "A" represents one of the homopolymer subunits, the "B" represents the other of the homopolymer subunits, and the hyphen represents a covalent bond.

In some diblock copolymers, the homopolymer subunits A and B preferentially interact with like subunits, and avoid interactions with one another. Such diblock copolymers will tend to self-assemble in chains having a repeating pattern that may be represented as A-B:B-A:A-B:B-A:A-B. In such pattern, the hyphens represent covalent bonds and the colons represent non-covalent interactions. Such self-assembly may be taken advantage of to form patterns over substrates.

FIG. 1 shows a construction 10 comprising a substrate 12 having a diblock copolymer pattern extending thereover. The substrate 12 has an upper surface 15 to which subunit A of the diblock copolymer has more affinity than does subunit B of the copolymer, (for instance, surface 15 may be more wettable by subunit A than by subunit B). The diblock copolymer is provided over surface 15 in a solvent so that the diblock copolymer may assemble in a preferred orientation. Accordingly, the diblock copolymer orients so that subunits A are directed toward surface 15.

Substrate 12 may comprise, for example, a monocrystalline semiconductor wafer (for example, a monocrystalline silicon wafer), either alone or in assemblies with other materials. The terms "semiconductive substrate" and "semiconductor substrate" as utilized herein mean any constructions comprising semiconductive material, including, but not limited to, bulk semiconductive materials such as semiconductive wafers (either alone or in assemblies comprising other materials thereon), and semiconductive material layers (either alone or in assemblies comprising other materials). The term "substrate" as used herein refers to any supporting structure, including, but not limited to, semiconductive substrates.

The diblock copolymers A-B may correspond to any of numerous diblock copolymers, including, but not limited to, the example diblock copolymer compositions discussed above.

The pattern created by the self-assembly of the diblock copolymer may be considered to comprise first segments corresponding to the A subunits, and second segments corresponding to the B subunits. The pattern may be diagrammatically represented by showing the segments as individual blocks, as shown in FIG. 2. Specifically, the first segments (i.e., the segments comprising subunit A) are shown as blocks 14 and 18, respectively; and the second segments (i.e., the segments comprising subunit B) are shown as blocks 16 and 20, respectively. The first and second segments alternate with one another throughout a pattern that extends outwardly from surface 15. Notably, block 18 contains two A subunits joined through non-covalent interactions (represented by a dashed-line extending through block 18), while the block 14 contains only a single A subunit. Thus, block 14 is only about half as thick as block 18.

In the shown embodiment, blocks 16 and 18 are about the same thickness as one another.

FIGS. 1 and 2 illustrate a pattern formed from a single surface. Diblock copolymers may also be utilized to form a repeating pattern between two surfaces, as shown in FIGS. 3 and 4. FIG. 3 shows a construction 30 comprising a pair of support structures 32 and 34 (the support structures are also identified by the label "S" in the figure) separated from one another by an intervening space 36. Space 36 may be chosen to be of appropriate length so that it corresponds to an integral number of repeating periods formed utilizing self-assembly of a diblock copolymer.

Support structures 32 and 34 have outer surfaces 33 and 35, respectively. Subunit A of the diblock copolymer has more affinity for surfaces 33 and 35 than does subunit B. Accordingly, the diblock copolymer orients so that subunits A are directed toward surfaces 33 and 35. The diblock copolymer self-assembles in a repeating pattern within space 36, with such pattern having first segments corresponding to the A subunits, and second segments corresponding to the B subunits.

FIG. 4 shows a diagrammatic representation of the pattern of FIG. 3. The first segments (i.e., the segments comprising subunit A) are shown as blocks 40, 44, 48 and 52, respectively; and the second segments (i.e., the segments comprising subunit B) are shown as blocks 42, 46 and 50, respectively. The first and second segments alternate with one another throughout the pattern that extends within space 36. The structures 32 and 34, and the blocks 42, 44, 46, 48 and 50, are all shown to have about the same widths as one another; with such widths being diagrammatically illustrated to be x. In contrast, blocks 40 and 52 have widths that are only about half of that of the other blocks, and accordingly are shown to have widths of about one-half x. The blocks 42, 44, 46, 48 and 50 are about twice as wide as the blocks 40 and 52 due to the blocks 42, 44, 46, 48 and 50 containing two A subunits, or two B subunits, joined through non-covalent interactions (represented by a dashed-line extending through blocks 42, 44, 46, 48 and 50), while the blocks 40 and 52 contain only a single A subunit.

The process of FIGS. 3 and 4 may be utilized to form a repeating pattern over a semiconductor substrate as illustrated in FIGS. 5 and 6. FIG. 5 shows a construction 60 comprising a semiconductor substrate 62 supporting a plurality of structures 64, 66, 68 and 70.

Substrate 62 comprises a base 72, and a material 74 supported over the base.

Base 72 may correspond to a semiconductor material, and in some embodiments may correspond to a monocrystalline silicon wafer.

Material 74 represents a material which is to be patterned during fabrication of integrated circuitry. Material 74 may be an electrically insulative material (for instance, may comprise one or more of silicon nitride, silicon dioxide, etc.), an electrically conductive material (for instance, may comprise one or more of various metals, metal-containing compositions, conductively-doped semiconductor material, etc.) or a semiconductive material (for instance, silicon, germanium, etc.). Although only the single material 74 is shown supported by base 72, in some embodiments multiple materials may be supported by the base. For instance, if it is desired to form NAND unit cells over base 72, there may be a plurality of gate materials stacked over base 72; with such gate materials ultimately being simultaneously patterned to form a plurality of gate constructions supported by base 72. As another example, if it is desired to form cross-point memory, there may be a plurality of materials stacked over base 72; with such materials ultimately being simultaneously patterned to form a plurality of lines extending across base 72. As yet another example, if it is desired to form DRAM, there may be a plurality of materials stacked over base 72; with such materials ultimately being simultaneously patterned to form a plurality of wordlines and/or bitlines extending across base 72.

Structures 64, 66, 68 and 70 comprise outer surfaces 65, 67, 69 and 71, respectively; and material 74 comprises an outer surface 75. Structures 64, 66, 68 and 70 comprise compositions to which one subunit of a diblock copolymer has more affinity than the other subunit of the diblock copolymer, while the two subunits of the diblock copolymer have about the same affinity as one another for surface 75. Accordingly, the diblock copolymer self-assembles into a pattern analogous to that discussed above with reference to FIGS. 3 and 4 within the spaces between the structures 64, 66, 68 and 70.

The structures 64, 66, 68 and 70 may be referred to as weirs by persons of ordinary skill in the art, with such terminology indicating that the self-assembled pattern from the diblock copolymer initiates from surfaces of the structures 64, 66, 68 and 70. Also, the utilization of topography-induced ordering of block copolymer may be referred to as graphoepitaxy by persons of ordinary skill in the art.

In the shown embodiment, structures 64, 66, 68 and 70 have the same widths as one another, with such widths being of a dimension illustrated as x; and the spaces between structures 64, 66, 68 and 70 have widths of 4x.

FIG. 6 shows construction 60 after a diblock copolymer is utilized to form a repeating pattern between structures 64, 66, 68 and 70. Such repeating pattern has segments 80 comprising A subunits of the diblock copolymer, and has segments 82 comprising B subunits of the diblock copolymer.

The segments 82 are all the same width as one another, with such width being shown to be about the same dimension x as the width of the structures 64, 66, 68 and 70. In contrast, the segments 80 are of differing widths relative to one another. The segments 80 that are not directly adjacent one of the structures 64, 66, 68 and 70 have the same width x as the segments 82, while the segments 80 that are directly adjacent one of the structures 64, 66, 68 and 70 have a width that is only about one-half x. In other words, the segments that are directly against structures 64, 66, 68 and 70 are shorter than the other segments. The reason that the segments directly adjacent structures 64, 66, 68 and 70 have only half of the width of other segments is because the segments directly adjacent the structures comprise only one subunit of diblock homopolymer, while the other segments comprise two subunits of diblock copolymer non-covalently interacting with one another.

A section of the structures and pattern of FIG. 6 may be diagrammatically represented as S*A-B:B-A:A-B:B-A*S, where S represents a structure (i.e., one of the structures 64, 66, 68 and 70), the asterisk represents bonding that may be covalent or non-covalent, the hyphen represents covalent bonding, and the colon represents non-covalent bonding.

The segments 80 and 82 of FIG. 6 may be referred to as first and second segments, respectively. The pattern formed between structures 64, 66, 68 and 70 may be considered to comprise the first and second segments alternating with one another, and to comprise truncated (i.e., partial-width) first segments directly adjacent to structures 64, 66, 68 and 70.

In subsequent processing, segments 80 may be selectively removed relative to segments 82, and also relative to structures 64, 66, 68 and 70. Alternatively, segments 82 and structures 64, 66, 68 and 70 may be selectively removed relative to segments 80. Regardless of whether segments 80 are removed, or segments 82 and structures 64, 66, 68 and 70 are removed, it would be desirable for the pattern formed after such removal to have a consistent pitch so that it could be subsequently utilized for creating a repeating pattern in material 74. Unfortunately, the truncated segments directly adjacent structures 64, 66, 68 and 70 disrupt the consistency of such pitch. Accordingly, some of the embodiments discussed below pertain to methods for compensating for the partial-width segments that are directly adjacent structures 64, 66, 68 and 70.

FIGS. 5 and 6 show the segments of the pattern formed from the diblock material as vertical sections (or lamella). In other embodiments, the segments may be cylindrical. Whether the segments are vertical or cylindrical may depend on, for example, the arrangement of surfaces adjacent the diblock material, and/or the interaction of the diblock material with the various adjacent surfaces. For instance, the surface 75 of material 74 may be neutral relative to wettability by either of the A and B subunits of the diblock material of FIG. 6, but would be preferentially wet by one of the A and B subunits if cylinders were to form.

FIG. 7 shows a mixture 90 comprising a plurality of diblock monomers arranged so that a subunit B is in the interior of a cylindrical pattern generated from the individual monomers. The cross-sectional view of FIG. 7 crosses through a cylinder of the B subunits, and such cylinder would extend into and out of the page relative to the shown cross-sectional view.

FIG. 8 shows a portion of a structure 100 analogous to the structures 60 of FIG. 6, but comprising a pattern formed from the diblock copolymer that contains cylinders instead of vertical segments. Similar numbering is used to describe FIG. 8 as was used in describing FIG. 6, where appropriate.

The construction of FIG. 8 comprises a pattern generated by the diblock material in a gap between structures 64 and 66. Such pattern includes cylinders 102, 104 and 106 of subunit B. The cylinders may extend linearly in and out of the page relative to the shown cross-sectional view. The cylinders may be round, elliptical, or other shapes along the shown cross-section.

The pattern formed from diblock subunits A and B of FIG. 8 may be considered to comprise alternating first and second segments 80 and 82 analogous to the segments discussed above with reference to FIG. 6. Also, similar to the problem discussed above with reference to FIG. 6, some of the segments 80 and 82 of the construction of FIG. 8 are truncated. Thus, regardless of whether the pattern formed by the diblock material comprises vertical blocks of the type shown in FIG. 6, or cylinders of the type shown in FIG. 8, the problem of having segments truncated adjacent supporting structures may exist. FIGS. 9-15 describe methods which may be utilized for compensating for such truncation problem.

Referring to FIG. 9, a construction 200 is shown at a processing stage similar to that of FIG. 5. Similar numbering will be utilized to describe construction 200 as is used above in describing the construction 60 of FIG. 5, where appropriate.

Construction 200 includes the semiconductor substrate 62 discussed above, with such substrate including the base 72 and material 74 that were described previously. The material 74 has an upper surface 75.

A plurality of supports 202, 204 and 206 are formed over the upper surface 75 of material 74. Supports 202, 204 and 206 may comprise any suitable composition or combination of compositions, and in some embodiments may comprise, consist essentially of, or consist of silicon dioxide. The supports may be formed with any suitable processing. Example processes that may be used for forming the supports are described below with reference to FIGS. 16-20.

The supports have widths of dimension x in the shown cross-sectional view, and are spaced from one another by intervening gaps (or spaces) 208 and 210 that are of widths 5x in the shown cross-sectional view. Width x may be a feature size attainable utilizing photolithographic processing in combination with spacer technologies, as shown below with reference to FIGS. 16-20. In some embodiments, the width x may be less than or equal to about 60 nanometers, and other embodiments the width x may be larger than 60 nanometers.

The upper surface 75 of material 74 is exposed within the spaces between supports 202, 204 and 206.

Supports 202, 204 and 206 may be referred to as weirs in some embodiments. The supports 202, 204 and 206 have outer surfaces 203, 205 and 207, respectively. In some embodiments, the outer surfaces of the supports may be considered examples of spaced apart raised edges extending upwardly from the surface 75 of substrate 62.

Referring to FIG. 10, a coating (or liner) 212 is formed along the outer edges 203, 205 and 207 of supports 202, 204 and 206. The coating may comprise a composition that is different from the composition of the outer surfaces of the supports. In some embodiments, the coating may comprise a material that may be selectively removed relative to the material of supports 202, 204 and 206; and/or may comprise a material to which the material of the supports may be selectively removed. Thus, the supports 202, 204 and 206 may comprise, consist essentially of, or consist of a first composition; and the coating may comprise, consist essentially of, or consist of a second composition that is different from the first composition. In some embodiments, supports 202, 204 and 206 may consist of silicon oxide (specifically, silicon dioxide), and the coating 212 may consist of germanium oxide or aluminum nitride. In some embodiments, supports 202, 204 and 206 may comprise inorganic material (such as oxides, nitrides, etc.), and coating 212 may comprise organic material (such as polymers, photoresist, etc.).

The coating may be utilized to compensate for partial-width segments of a block copolymer pattern formed between supports 202, 204 and 206. If the block copolymer is a diblock copolymer of formula A-B, and if the partial-width segments are from subunit A of the diblock copolymer, then in some embodiments the material 212 may be a material having similar chemical properties relative to subunit A. For instance, if the diblock copolymer is PS-b-MMA, and if the subunit A is the methylmethacrylate, then coating 212 may comprise one or more acrylates, and in some embodiments may comprise one or more methacrylates. Alternatively, if the diblock copolymer is PS-b-MMA, and if the subunit A is the polystyrene, then coating 212 may comprise one or more compositions containing styrene. In other embodiments, the coating 212 may comprise silicon nitride, metals, metal nitride, etc.; with the coating being of a composition that can be etched selectively to the supports 202, 204 and 206, and the B subunit of the block copolymer Coating 212 is shown formed to a thickness of one-half x. The coating may be formed utilizing any suitable methodology. For instance, the coating may be formed by: using one or both of atomic layer deposition (ALD) and chemical vapor deposition (CVD) to deposit a layer of material 212 across exposed surface 75 of material 74, and across surfaces 203, 205 and 207 of supports 202, 204 and 206; providing a mask to protect the coating that is along the surfaces of the support structures while leaving other regions of the coating unprotected; using an etch to remove the unprotected coating; and then removing the mask to leave the structure shown in FIG. 10. Alternatively, processing may be utilized which selectively deposits the coating only along exposed surfaces of supports 202, 204 and 206.

In some embodiments (not shown), coating 212 may be subjected to an anisotropic etch (i.e., a so-called spacer etch) to remove the coating from over the supports 202, 204 and 206 while leaving the coating along sidewalls of the supports. Such embodiments may be utilized in applications in which it is going to be desired to remove supports 202, 204 and 206 in subsequent processing, (an example of such applications is described with reference to FIG. 14).

Referring to FIG. 11, block copolymer is utilized to form patterns across spaces 208 and 210. In the shown embodiment, the block copolymer is a diblock copolymer (in other words, contains two subunits A and B). In other embodiments, the block copolymer may be a triblock copolymer or other multi-block copolymer, which would lead to a different pattern than that shown.

The pattern formed within spaces 208 and 210 comprises the first and second segments 80 and 82 that were discussed above with reference to FIG. 6. The first and second segments (80 and 82, respectively) alternate with one another within spaces 208 and 210. The segments 80 that are directly adjacent to coating 212 are truncated (i.e., partial-width) relative to the others of segments 80 and 82. Specifically, the segments 80 and 82 that are not directly adjacent to coating 212 are shown to have widths of x, while the segments 80 that are directly adjacent to coating 212 have widths of one-half x.

A difference between the construction 200 of FIG. 11 and the construction 60 of FIG. 6 is that construction 200 comprises coating 212 adjacent the truncated segments. The coating 212 may be of a composition that behaves like the segments 80 (i.e. the segments comprising subunit A of the diblock copolymer) during subsequent processing. For instance, coating 212 may be of a composition that can be selectively removed along with the segments 80 relative to segments 82 (i.e., the segments comprising subunit B of the diblock copolymer) and relative to supports 202, 204 and 206; or may be of a composition that remains with the segments 80 during selective removal of the supports and the segments 82. Thus, the coating may be considered an extension of the truncated segments 80 during subsequent processing. Accordingly, the coating may be considered to compensate for the partial-width segments 80 at the edges of the diblock-formed patterns during subsequent processing. In the shown embodiment, the truncated segments have widths of one-half x, and the coating 212 also has a width of one-half x. Thus, the combined width of a truncated segment and the adjacent coating 212 is the same width as the non-truncated segments, and as the support structures 202, 204 and 206.

In some embodiments, supports 202, 204 and 206 comprise material that behaves similar to the material of segments 82 during subsequent processing; and the coating 212 comprises material that behaves similarly to the material of segments 80 during subsequent processing. Thus, supports 210, 204 and 206, and segments 82, may be considered a first class of structures; and coating 212 and segments 80 may be considered a second class of structures. The second class of structures may be removed selectively relative to the first class of structures, or the first class of structures may be removed selectively relative to the second class of structures. Regardless, a pitch "P" may be considered as a distance across a structure of the first class and an adjacent structure of the second class, and in the shown embodiment is 2x.

The supports, coating and various patterned segments of construction 200 may be designated by the shorthand SC*A-B:B-A:A-B:B-A*CS; where S represents a support, C represents coating, the hyphen represents covalent interactions, the asterisk represents interactions that may be covalent or non-covalent, and the colon represents non-covalent interactions.

The embodiment of FIG. 11 is one of many patterns that may be formed utilizing diblock copolymer. In some embodiments, numerous types of possible patterns that may be formed with a diblock copolymer A-B are represented as SC*A-B:B-A:A-B (:B-A:A-B)n :B-A*CS, where the supports are represented as S, where the coating is represented as C, where the asterisk indicates an interaction that may be covalent or non-covalent, where n is an integer of zero or greater, and where the colon represents a non-covalent interaction.

In the embodiment of FIG. 11, the coating thickness is such that the distance across C*A is about the same as the distance across A:A. It is noted that in some embodiments the distance across C*A can be about the same as the distance across A:A even if C does not have a thickness of about one-half x. For instance, steric or other interactions of C and A may cause the segment of A that is adjacent C to have a different thickness than other segments of A. In such instances, C may be provided to a thickness to compensate for such alteration in the thickness of the segment A adjacent C so that C*A is about the same as A:A.

The various materials of FIG. 11 may be ultimately utilized to form a patterned mask that can be subsequently used for fabrication of integrated circuitry. As discussed above, supports 202, 204 and 206, and segments 82, may be considered a first class a structures; and coating 212 and segments 80 may be considered a second class of structures. The second class of structures may be removed selectively relative to the first class of structures, or the first class of structures may be removed selectively relative to the second class of structures.

FIG. 12 illustrates an embodiment in which the second class of structures (i.e. the coating 212 and segments 80) are selectively removed relative to the first class of structures (i.e., supports 202, 204 and 206, and segments 82). If the coating comprises aluminum nitride or germanium oxide, such may be removed by exposure to an aqueous solution.

The construction of FIG. 12 comprises a patterned mask having the first class of structures (i.e., supports 202, 204 and 206, and segments 82); and having a plurality of gaps 220 between the structures of the first class. The structures have widths of x, and the gaps also have widths of x. Accordingly, the patterned mask corresponds to a pattern of repeating structures having a pitch (P) of 2x.

In some embodiments in which the pattern of FIG. 11 is described as SC*A-B:B-A:A-B:B-A*CS, the removal of coating 212 (FIG. 11) and segments 80 (FIG. 11) may be considered removal of A and C selectively relative to S and B.

Referring to FIG. 13, the patterned mask of FIG. 12 may be utilized to fabricate a pattern within material 74. In some embodiments, material 74 may be representative of one or more materials utilized for fabrication of memory architecture (e.g., NAND, DRAM and/or cross-point memory). In such embodiments, the transfer of a pattern into material 74 may represent patterning of one or more materials into structures of memory architecture. For instance, patterning of material 74 may represent patterning of one or more gate materials of NAND unit cells; may represent patterning of a plurality of lines of cross-point memory cells; and/or may represent patterning of wordlines and/or bitlines of DRAM. In some embodiments, the patterning of material 74 may be utilized to produce 4F² architecture. In some embodiments, the patterning of material 74 may create a vast array of parallel lines for 4-bit structures.

FIG. 14 illustrates a processing stage subsequent to FIG. 11 of an embodiment alternative to that of FIG. 12, and specifically of an embodiment in which the first class of structures (i.e., supports 202, 204 and 206, and segments 82) are selectively removed relative to the second class of structures (i.e. the coating 212 and segments 80). The construction of FIG. 14 comprises a patterned mask having the second class of structures (i.e. the coating 212 and segments 80); and having a plurality of gaps 222 between the structures of the second class. The structures have widths of x, and the gaps also have widths of x. Accordingly, the patterned mask corresponds to a pattern of repeating structures having a pitch (P) of 2x.

The removal of the supports 202, 204 and 206 (FIG. 11) to form the construction of FIG. 14 may be accomplished after first removing portions of the coating 212 from over the supports. The removal of such portions of the coating may be accomplished with any suitable processing, including, for example, etching and/or planarization.

In some embodiments in which the pattern of FIG. 11 is described as SC*A-B:B-A:A-B:B-A*CS, the removal of supports 202, 204 and 206 (FIG. 11) and segments 82 (FIG. 11) may be considered removal of S and B selectively relative to A and C.

Referring to FIG. 15, the patterned mask of FIG. 14 may be utilized to fabricate a patterned within material 74. As discussed previously, the patterning of material 74 may, for example, represent patterning of one or more gate materials of NAND unit cells; represent patterning of a plurality of lines of cross-point memory cells; and/or represent patterning of wordlines and/or bitlines of DRAM.

The patterns formed from diblock copolymer are shown in FIGS. 11-15 to comprise vertical segments (i.e., lamella) analogous to those of FIG. 6. In other embodiments (not shown) procedures analogous to those shown in FIGS. 11-15 may be utilized with diblock copolymer in applications in which the diblock copolymer forms cylinders, such as cylinders of the type shown in FIG. 8.

As discussed above, the supports 202, 204 and 206 of FIG. 9 may be of a particular size (shown as x in FIG. 9), and spaced from one another by particular distances (shown as 5x in FIG. 9). The supports may be fabricated to the desired size and spacing by any suitable method. FIGS. 16-20 illustrate a couple of example methods that may be used.

Figure 16:
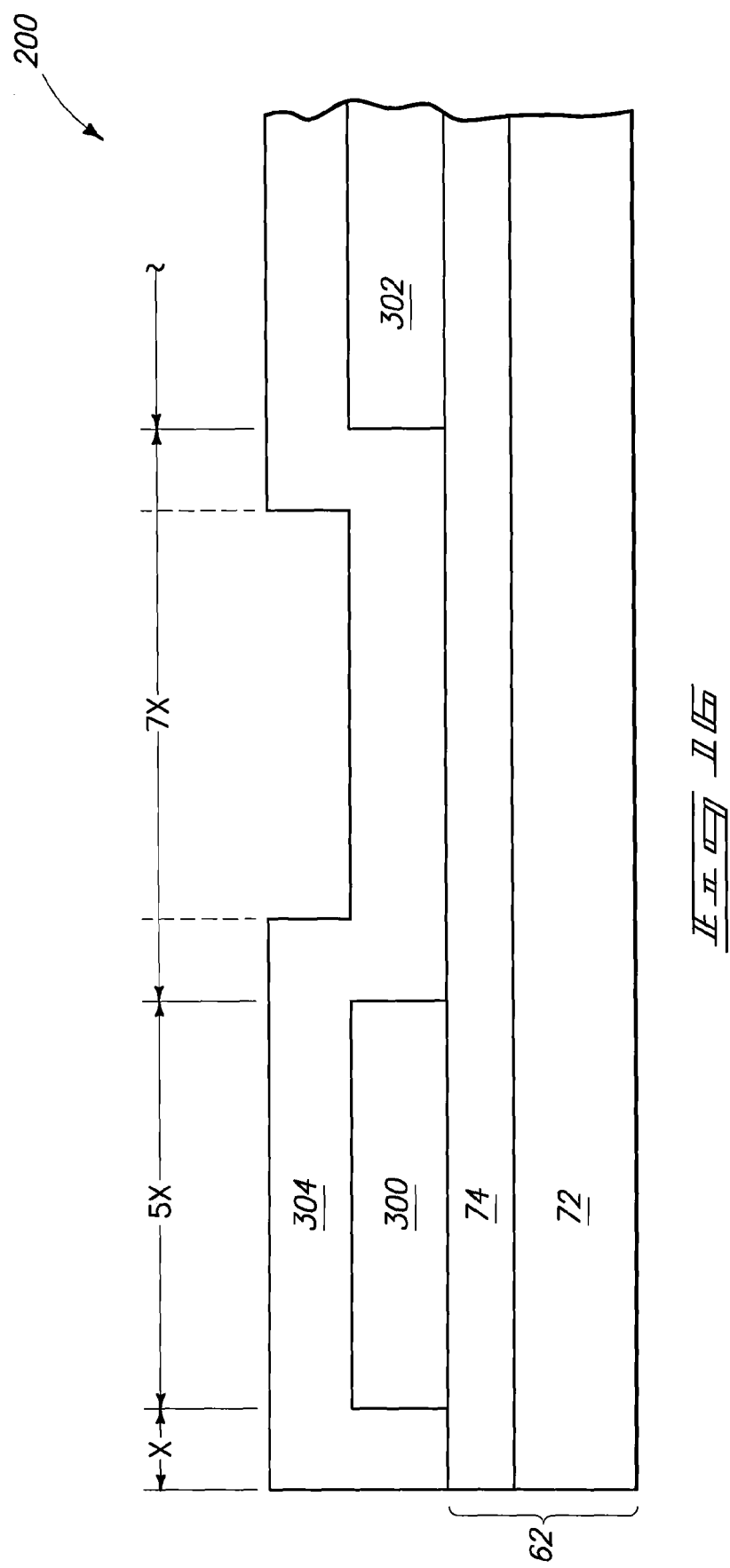
FIGS. 16-18 illustrate an example process for forming a structure of the type shown in FIG. 9.

Referring to FIG. 16, construction 200 is illustrated at a processing stage prior to that of FIG. 9. The construction comprises a pair of patterned blocks 300 and 302 over substrate 62. Blocks 300 and 302 may comprise photoresist, and may be formed by photolithographic processing. The blocks have dimensions of about 5x, and are separated by spaces of about 7x.

A material 304 extends over and between the blocks. Material 304 has a thickness of about x. Material 304 may comprise any suitable composition, and in some embodiments may comprise silicon dioxide, silicon nitride, or silicon oxynitride.

Figure 17:
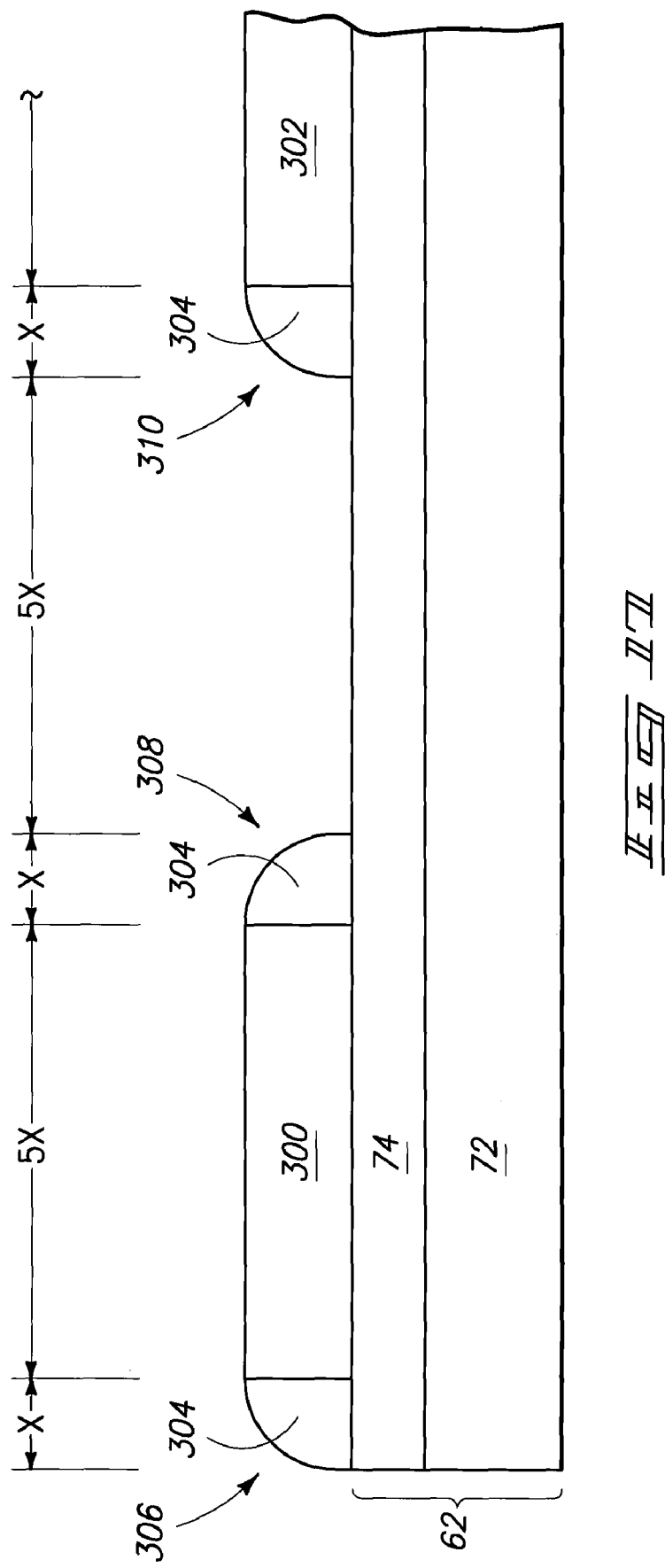

Referring to FIG. 17, material 304 is anisotropically etched into spacers 306, 308 and 310.

Figure 18:
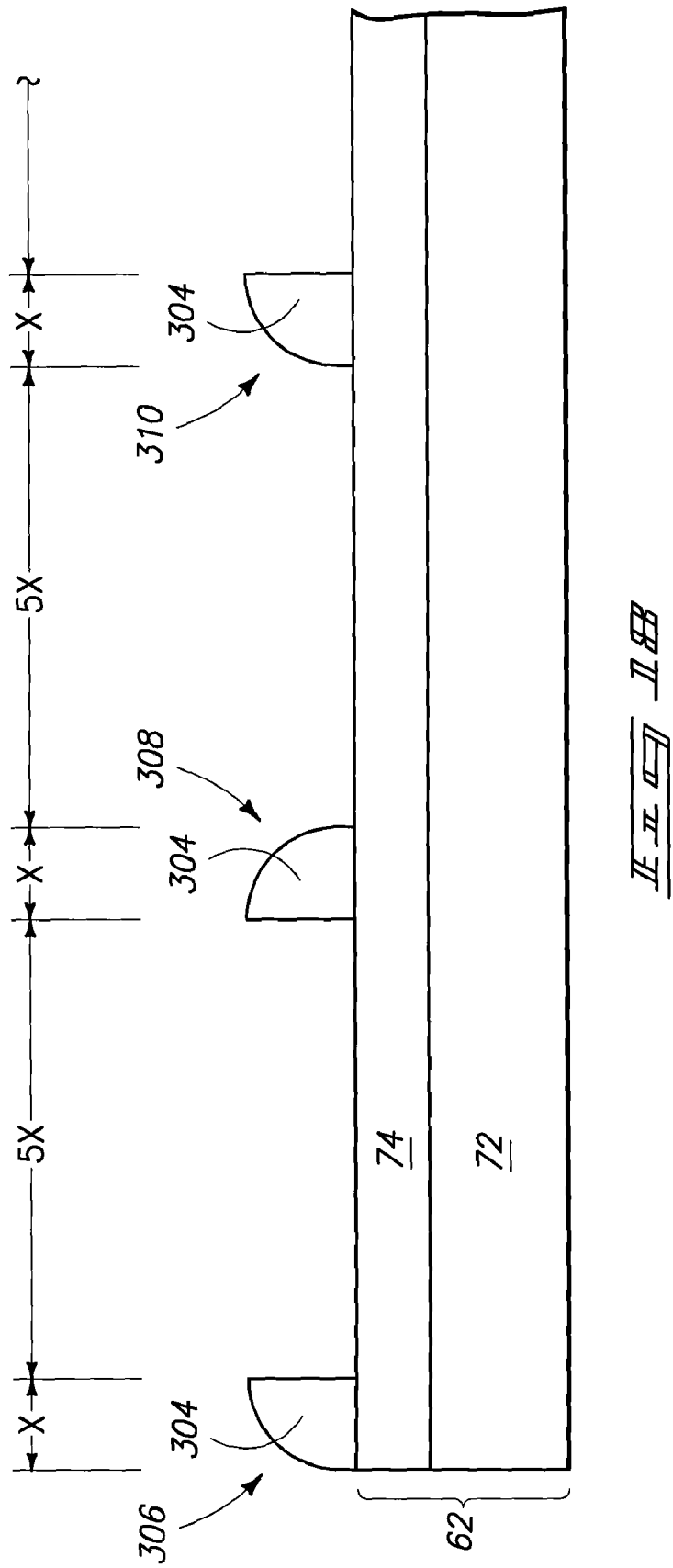

Referring to FIG. 18, blocks 300 and 302 (FIG. 17) are removed. Spacers 306, 308 and 310 remain over substrate 62. The spacers comprise widths of x, and are separated from one another by distances of 5x. Thus, the spacers 306, 308 and 310 may be utilized as the supports (or weirs) 202, 204 and 206 of FIG. 9.

In some embodiments, the spacers of FIG. 18 are considered difficult to be utilized directly as supports of the type shown in FIG. 9 due to the curved outer surfaces of the spacers. In such embodiments, it may be desirable to utilize the spacers to pattern another material, and then to utilize such other material as the support structures of FIG. 9.

Figure 19:
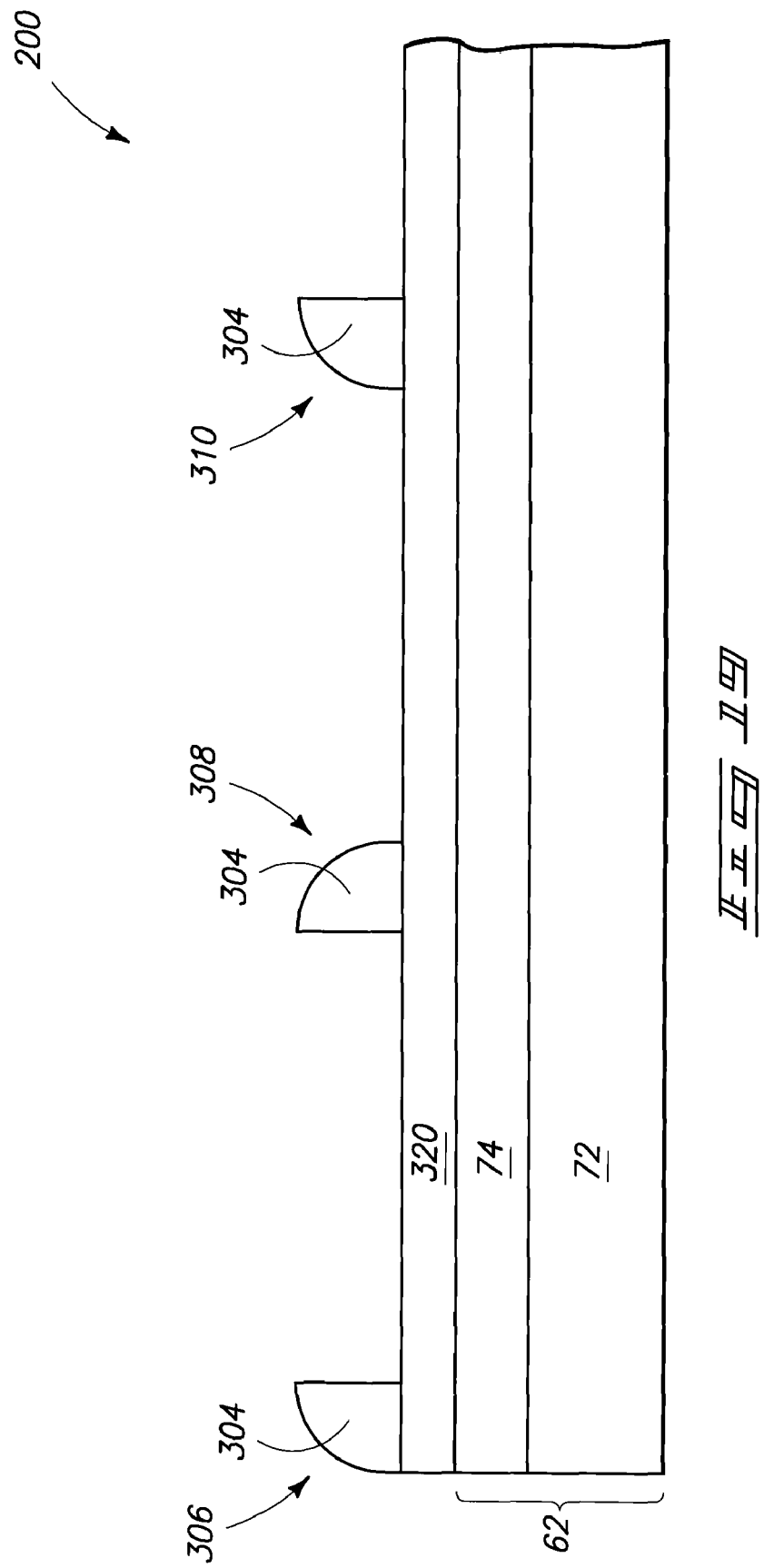

FIG. 19 shows the spacers 306, 308 and 310 of FIG. 18 separated from substrate 62 by an intervening material 320.

FIG. 20 shows construction 200 after the spacers 306, 308 and 310 (FIG. 18) have been utilized to pattern material 320, and have then been removed. Such has formed material 320 into a plurality of blocks 322, 324 and 326. Such blocks have widths x, and are spaced from one another by gaps 5x. The blocks may thus be utilized as the support structures 202, 204 and 206 of FIG. 9.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a pattern between weirs with block copolymer, comprising:
    forming liners along surfaces of the weirs; and
    forming the pattern with the block copolymer while utilizing the liners to compensate for partial-width segments of the pattern in regions adjacent the weirs.

2. The method of claim 1 wherein the block copolymer is diblock copolymer.

3. The method of claim 2 wherein the diblock copolymer is PS-b-MMA, PS-b-P2VP or PS-b-PDMS.

4. The method of claim 3 wherein the liners comprise one or more acrylates.

5. The method of claim 3 wherein the liners comprise one or more methacrylates.

6. The method of claim 3 wherein the liners comprise one or more compositions containing styrene.

7. The method of claim 1 wherein the weir surfaces consist of a first composition, and wherein the liners consist of a second composition that is different from the first composition.

8. The method of claim 7 wherein the first composition is silicon oxide, and wherein the second composition comprises one or more of germanium oxide, aluminum nitride, silicon nitride, metal and metal nitride.

9. The method of claim 7 wherein the first composition is inorganic, and wherein the second composition is organic.

10. A method of forming a pattern, comprising:
    providing a pair of spaced apart supports over a substrate, a surface of the substrate being exposed within a space between the supports;
    forming a coating along the outer surfaces of the supports, said coating having a thickness;
    utilizing a diblock copolymer to form a pattern across the space, the diblock copolymer comprising a formula A-B, where A and B are blocks of the diblock copolymer, and where the hyphen represents that blocks are covalently bonded to one another;

the supports, coating and pattern being SC*A-B:B-A:A-B (B-A:A-B)$_n$:B-A*CS, where the supports are represented as S, where the coating is represented as C, where the asterisk indicates an interaction that may be covalent or non-covalent, where n is an integer of zero or greater, and where the colon represents a non-covalent interaction; and the coating thickness being such that the distance across C*A is about the same as the distance across A:A.

11. The method of claim 10 wherein the diblock copolymer is PS-b-MMA, PS-b-P2VP or PS-b-PDMS.

12. The method of claim 11 wherein C comprises one or more acrylates.

13. The method of claim 10 wherein S consists of silicon oxide, and wherein C consists of germanium oxide or aluminum nitride.

14. The method of claim 10 further comprising removing A and C selectively relative to S and B.

15. The method of claim 10 further comprising removing S and B selectively relative to A and C.

16. A method of forming a pattern, comprising:
providing a structure comprising surface and a pair of spaced apart raised edges extending upwardly from the surface;
forming a coating along the edges; and
utilizing a diblock copolymer to form a pattern across a space between the edges, the pattern comprising first and second segments that alternate with one another, the diblock copolymer comprising a pair of block constituents that have different affinities for the coating relative to one another; the pattern having truncated regions of the first segments adjacent the edges, the coating having a thickness which adjusts for such truncation such that the coating thickness in combination with a thickness of a truncated region is a full thickness of a first segment of the pattern.

17. The method of claim 16 wherein the coating consists of an oxide, and wherein the diblock copolymer is PS-b-MMA, PS-b-P2VP or PS-b-PDMS.

18. The method of claim 17 wherein the coating consists of aluminum nitride or germanium oxide.

19. The method of claim 16 further comprising removing the second segments selectively relative to the first segments.

20. The method of claim 16 further comprising removing the first segments and coating selectively relative to the second segments.

21. A method of forming a pattern, comprising:
providing a pair of spaced apart weirs over a substrate, a surface of the substrate being exposed within a space between the weirs;
forming a coating along the outer surfaces of the weirs, said coating having a thickness; and
utilizing a diblock copolymer to form a pattern across the space, the diblock copolymer comprising a pair of block constituents that have different affinities for the coating relative to one another; the pattern comprising alternating segments; the segments adjacent to the coating being shorter than the segments that are not adjacent to the coating; the coating thickness being about the amount by which said segments adjacent to the coating are shorter than said segments that are not adjacent to the coating.

22. The method of claim 21 wherein the coating comprises an organic material.

23. The method of claim 21 wherein the coating comprises an inorganic material.

24. The method of claim 21 wherein the coating consists of an oxide, and wherein the diblock copolymer is PS-b-MMA, PS-b-P2VP or PS-b-PDMS.

25. The method of claim 21 wherein the coating comprises one or more methacrylates, and wherein the diblock copolymer is polystyrene-b-poly(methylmethacrylate).

26. A method of forming a pattern, comprising:
forming spaced apart structures over a semiconductor substrate surface, said structures having outer edges;
forming liners along the outer edges of the structures;
utilizing a diblock copolymer to form patterns across spaces between the edges, the patterns comprising first and second segments that alternate with one another; the patterns having truncated regions of the first segments adjacent the edges, the liners having a thickness which adjusts for such truncation such that the liner thickness in combination with a thickness of a truncated region is a full thickness of a first segment of the patterns;
removing the structures and the second segments to leave a patterned mask comprising the first segments and the liners; and
utilizing the patterned mask to define locations of integrated circuit components within the substrate.

27. The method of 26 wherein the integrated circuit components are part of a DRAM array.

28. The method of 26 wherein the integrated circuit components are part of a NAND array.

29. The method of 26 wherein the integrated circuit components are part of a cross-point memory array.

30. A method of forming a pattern, comprising:
forming spaced apart structures over a semiconductor substrate surface, said structures having outer edges;
forming liners along the outer edges of the structures;
utilizing a diblock copolymer to form patterns across spaces between the edges, the patterns comprising first and second segments that alternate with one another; the patterns having truncated regions of the first segments adjacent the edges, the liners having a thickness which adjusts for such truncation such that the liner thickness in combination with a thickness of a truncated region is a full thickness of a first segment of the patterns;
removing the first segments and the liners to leave a patterned mask comprising the structures and the second segments; and
utilizing the patterned mask to define locations of integrated circuit components within the substrate.

31. The method of 30 wherein the integrated circuit components are part of a DRAM array.

32. The method of 30 wherein the integrated circuit components are part of a NAND array.

33. The method of 30 wherein the integrated circuit components are part of a cross-point memory array.

34. The method of 30 wherein the liners consist of germanium oxide or aluminum nitride, and wherein the removal of the liners comprises exposure of the liners to an aqueous solution.

35. The method of 30 wherein the liners comprise one or more acrylates, and wherein the diblock copolymer is polystyrene-b-poly(methylmethacrylate).

* * * * *

UNITED STATES PATENT AND TRADEMARK OFFICE
CERTIFICATE OF CORRECTION

PATENT NO. : 8,173,034 B2  
APPLICATION NO. : 12/272517  
DATED : May 8, 2012  
INVENTOR(S) : Dan Millward et al.

It is certified that error appears in the above-identified patent and that said Letters Patent is hereby corrected as shown below:

On the title page, item (56), under "Other Publications", in column 2, line 11, delete "materialstoday," and insert -- materials today, --, therefor.

In column 12, line 28, in Claim 27, delete "of" and insert -- of claim --, therefor.

In column 12, line 30, in Claim 28, delete "of" and insert -- of claim --, therefor.

In column 12, line 32, in Claim 29, delete "of" and insert -- of claim --, therefor.

In column 12, line 51, in Claim 31, delete "of" and insert -- of claim --, therefor.

In column 12, line 53, in Claim 32, delete "of" and insert -- of claim --, therefor.

In column 12, line 55, in Claim 33, delete "of" and insert -- of claim --, therefor.

In column 12, line 57, in Claim 34, delete "of" and insert -- of claim --, therefor.

In column 12, line 61, in Claim 35, delete "of" and insert -- of claim --, therefor.

Signed and Sealed this  
Third Day of July, 2012

David J. Kappos  
*Director of the United States Patent and Trademark Office*